United States Patent
Chudzik et al.

(10) Patent No.: US 7,943,457 B2
(45) Date of Patent: May 17, 2011

(54) DUAL METAL AND DUAL DIELECTRIC INTEGRATION FOR METAL HIGH-K FETS

(75) Inventors: Michael P. Chudzik, Danbury, CT (US); Wiliam K. Henson, Beacon, NY (US); Rashmi Jha, Toledo, OH (US); Yue Liang, Beacon, NY (US); Ravikumar Ramachandran, Pleasantville, NY (US); Richard S. Wise, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/423,236

(22) Filed: Apr. 14, 2009

(65) Prior Publication Data

US 2010/0258881 A1    Oct. 14, 2010

(51) Int. Cl.
H01L 21/336  (2006.01)

(52) U.S. Cl. ........ 438/199; 438/142; 438/151; 438/157; 438/283; 438/798; 257/407

(58) Field of Classification Search .................. 257/407; 438/142, 151, 153, 154, 157, 197, 199, 400, 438/798, 283
See application file for complete search history.

(56) References Cited

U.S. PATENT DOCUMENTS

| | | |
|---|---|---|
| 6,693,004 B1 | 2/2004 | Halliyal et al. |
| 6,750,066 B1 | 6/2004 | Cheung et al. |
| 6,767,847 B1 | 7/2004 | Hu et al. |
| 6,893,984 B2 | 5/2005 | Ahn et al. |
| 6,979,855 B2 | 12/2005 | Ahn et al. |
| 7,064,058 B2 | 6/2006 | Ahn et al. |
| 7,091,118 B1 | 8/2006 | Pan et al. |
| 7,135,369 B2 | 11/2006 | Ahn et al. |
| 7,135,421 B2 | 11/2006 | Ahn et al. |
| 7,160,577 B2 | 1/2007 | Ahn et al. |
| 7,192,892 B2 | 3/2007 | Ahn et al. |
| 7,205,620 B2 | 4/2007 | Ahn et al. |
| 7,259,434 B2 | 8/2007 | Ahn et al. |
| 7,405,454 B2 | 7/2008 | Ahn et al. |
| 2004/0092073 A1 | 5/2004 | Cabral, Jr. et al. |

(Continued)

OTHER PUBLICATIONS

Application No. PCT/US2010/030980—Filing Date: Apr. 14, 2010 Applicant: International Business Machines Corporation ISR/Written Opinion.

*Primary Examiner* — David Vu
*Assistant Examiner* — Suberr Chi
(74) *Attorney, Agent, or Firm* — Scully, Scott, Murphy & Presser, P.C.; Joseph P. Abate, Esq.

(57) ABSTRACT

The present invention, in one embodiment, provides a method of forming a semiconductor device that includes providing a substrate including a first conductivity type region and a second conductivity type region; forming a gate stack including a gate dielectric atop the first conductivity type region and the second conductivity type region of the substrate and a first metal gate conductor overlying the high-k gate dielectric; removing a portion of the first metal gate conductor that is present in the first conductivity type region to expose the gate dielectric present in the first conductivity type region; applying a nitrogen based plasma to the substrate, wherein the nitrogen based plasma nitrides the gate dielectric that is present in the first conductivity type region and nitrides the first metal gate conductor that is present in the second conductivity type region; and forming a second metal gate conductor overlying at least the gate dielectric that is present in the first conductivity type region.

15 Claims, 3 Drawing Sheets

U.S. PATENT DOCUMENTS

| | | |
|---|---|---|
| 2005/0035417 A1* | 2/2005 | Visokay ........................ 257/407 |
| 2006/0237803 A1 | 10/2006 | Zhu et al. |
| 2006/0286802 A1 | 12/2006 | Yu et al. |
| 2007/0138563 A1 | 6/2007 | Callegari et al. |
| 2007/0152273 A1 | 7/2007 | Callegari et al. |
| 2007/0152276 A1 | 7/2007 | Arnold et al. |
| 2008/0191292 A1 | 8/2008 | Callegari et al. |
| 2008/0203485 A1 | 8/2008 | Chudzik et al. |
| 2008/0249650 A1 | 10/2008 | Allen et al. |
| 2008/0280404 A1 | 11/2008 | Chudzik et al. |

* cited by examiner

DUAL METAL AND DUAL DIELECTRIC INTEGRATION FOR METAL HIGH-K FETS

The present disclosure generally relates to microelectronics. In one embodiment, the present invention relates to gate structures in metal oxide semiconductor field effect transistors (MOSFETs).

BACKGROUND OF THE INVENTION

Field effect transistors (FETs) are widely used in the electronics industry for switching, amplification, filtering and other tasks related to both analog and digital electrical signals. Most common among these are metal-oxide-semiconductor field-effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type (NMOS and PMOS) transistors are used to fabricate logic and other circuitry.

Continuing trends in semiconductor device manufacturing include reduction in electrical device feature sizes (scaling), as well as improvements in device performance in terms of device switching speed and power consumption. MOS transistor performance may be improved by reducing the distance between the source and the drain regions under the gate conductor of the device, known as the gate or channel length, and by reducing the thickness of the layer of gate dielectric that is formed over the semiconductor surface. However, there are electrical and physical limitations on the extent to which the thickness of $SiO_2$ gate dielectrics can be reduced.

Recent MOS and CMOS transistor scaling efforts have accordingly focused on high-k dielectric materials having dielectric constants greater than that of $SiO_2$ (e.g., greater than about 3.9), which can be formed in a thicker layer than scaled $SiO_2$, and yet which produce equivalent field effect performance. The relative electrical performance of such high-k dielectric materials is often expressed as equivalent oxide thickness (EOT), because the high-k material layer may be thicker, while still providing the equivalent electrical effect of a much thinner layer of $SiO_2$. Since the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

Hafnium-based High-k/Metal Gate stacks are one alternative to SiON/Poly-Si gate stacks. Although high-k dielectrics offer significant scaling with respect to SiON, on account of their higher dielectric constant, the effect of the dielectric constant of these gate stacks is tempered by the thermodynamically favored growth of a low dielectric constant $SiO_2$-like interface layer between the hafnium based high-k gate dielectric and the silicon based substrate, on which the hafnium based high-k gate dielectric is typically formed.

SUMMARY OF THE INVENTION

A method of forming a gate structure is provided that in one embodiment includes providing a substrate including a first conductivity type region and a second conductivity type region; forming a gate stack including a gate dielectric atop the first conductivity type region and the second conductivity type region of the substrate and a first metal gate conductor atop the gate dielectric; removing a portion of the first metal gate conductor that is present in the first conductivity type region to expose the gate dielectric present in the first conductivity type region, wherein a remaining portion of the first metal gate conductor is present in the second conductivity type region; nitriding the gate dielectric that is present in the first conductivity type region and the first metal gate conductor that is present in the second conductivity type region; and forming a second metal gate conductor atop at least the gate dielectric that is present in the first conductivity type region.

In another embodiment, the method of forming a gate structure includes providing a substrate including a first conductivity type region and a second conductivity type region; forming a gate stack including a gate dielectric atop the first conductivity type region and the second conductivity type region of the substrate and a first metal gate conductor atop the gate dielectric; forming an etch mask overlying the second conductivity type region, wherein the first conductivity type region is exposed; removing a portion of the first metal gate conductor that is present in the first conductivity type region to expose the gate dielectric present in the first conductivity type region; removing the etch mask; applying a nitrogen based plasma to the gate dielectric that is present in the first conductivity type region and to the first metal gate conductor that is present in the second conductivity type region; and forming a second metal gate conductor atop at least the gate dielectric that is present in the first conductivity type region.

In an even further embodiment, the method includes providing a substrate including an n-type device region and a p-type device region; forming a gate stack including a gate dielectric atop the n-type device region and the p-type device region, and a first metal gate conductor atop the gate dielectric; forming an etch mask atop the p-type device region, wherein the n-type device region is exposed; removing a portion of the first metal gate conductor that is present in the n-type device region to expose the gate dielectric present in the n-type device region; removing the etch mask; applying a nitrogen based plasma to the gate dielectric that is present in the n-type device region and to the first metal gate conductor that is present in the p-type device region; and forming a second metal gate conductor atop at least the gate dielectric that is present in the n-type device region.

In another aspect, a semiconductor device is provided. Broadly, the semiconductor device includes a substrate including a p-type device region and an n-type device region; at least one nFET present in the n-type device region including a gate structure including a Hf-containing gate dielectric present on the substrate having a nitrided upper surface, and a gate conductor directly on the nitrided upper surface of the Hf-containing gate dielectric; and at least one pFET present in the p-type device region including a gate structure including a Hf-containing gate dielectric present on the substrate having an upper surface substantially free of nitride, and a gate conductor present directly on the Hf-containing gate dielectric having the upper surface substantially free of nitride, wherein an upper surface of the gate conductor in the gate structure of the at least one pFET is a nitrided upper surface.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

Figure 1:
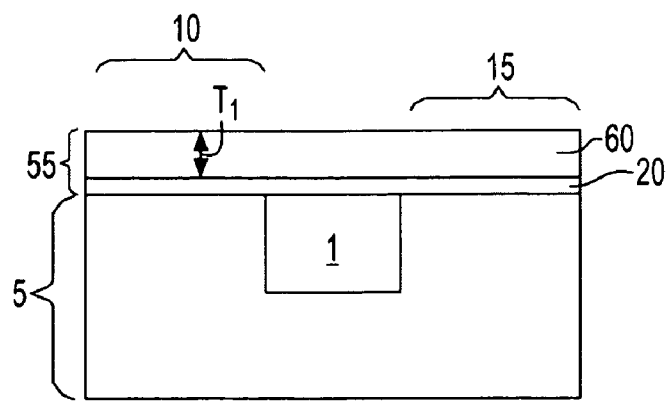
FIG. 1 is a side cross-sectional view depicting a substrate including a first conductivity type region, i.e., n-type device region, and a second conductivity type region, i.e., p-type device region, and a gate stack including a gate dielectric atop the substrate and a first metal gate conductor atop the gate dielectric.

The above drawings represent some embodiments of the present invention, which are provided for illustrative purposes only are not intended to limit the scope of the invention solely thereto.

DETAILED DESCRIPTION OF THE INVENTION

The present invention, which in one embodiment provides a method for forming gate structures to semiconductor devices, e.g., field effect transistors (FET), having a metal gate conductor/high-k dielectric stack with a threshold voltage tuned to the conductivity type of the semiconductor device, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention. When describing the methods and structures of the present invention, the following terms have the following meanings, unless otherwise indicated.

As used herein, "semiconductor device" refers to an intrinsic semiconductor material that has been doped, that is, into which a doping agent has been introduced, giving it different electrical properties than the intrinsic semiconductor. Doping means adding dopant atoms to an intrinsic semiconductor, which changes the electron and hole carrier concentrations of the intrinsic semiconductor at thermal equilibrium. Dominant carrier concentrations in an extrinsic semiconductor classify it as either an n-type or p-type semiconductor.

As used herein, the terms "conductivity type" and "conductivity region" denote a p-type or n-type doped semiconductor.

As used herein, "P-type" refers to the addition of impurities to an intrinsic semiconductor that creates deficiencies of valence electrons, such as the addition of boron, aluminum, or gallium to a type IV semiconductor, such as silicon.

As used herein, "N-type" refers to the addition of impurities to an intrinsic semiconductor that contribute free electrons, such as the addition of antimony, arsenic, or phosphorous to a type IV semiconductor, such as silicon.

As used herein, a "field effect transistor (FET)" is a transistor in which output current, i.e., source-drain current, is controlled by the voltage applied to the gate. A field effect transistor has three terminals, i.e., a gate, a source and a drain.

As used herein, the term "drain" means a doped region semiconductor substrates located at the end of the channel in field effect transistors (FET); in which carriers are flowing out of the transistor through the drain.

As used herein, the term "source" is a doped region from which majority carriers are flowing into the channel.

As used herein, the term "channel" is the region between the source and drain of a metal oxide semiconductor transistor that becomes conductive when the transistor is turned on.

A "gate structure" means a structure used to control output current (i.e., flow of carriers in the channel) of a semiconducting device, such as a field effect transistor (FET).

As used herein, the term "gate conductor" denotes a material having a bulk resistivity ranging from $10^{-4}$ Ω-cm to $10^{-6}$ Ω-cm, which is positioned atop a gate dielectric.

As used herein, a "metal" is an electrically conductive material, wherein in metals atoms are held together by the force of metallic bond, and the energy band structure of metal's conduction and valence bands overlap, and hence, there is no energy gap.

The terms "nitrided", "nitriding" and "to nitride" in reference to nitriding a metal, such as a metal gate conductor, or nitriding a dielectric, such as a gate dielectric, mean that nitrogen is introduced into the material, i.e., dielectric or metal, from an external source.

As used herein, a "pFET" refers to a field effect transistor having source/drain regions created by the addition of impurities, such as boron, aluminum or gallium to an intrinsic Si substrate, to create deficiencies of valence electrons to an intrinsic semiconductor.

As used herein, an "nFET" refers to a field effect transistor having source/drain regions created by created the addition of impurities that contribute free electrons to an intrinsic semiconductor, such as antimony, arsenic or phosphorous to an intrinsic silicon substrate.

As used herein, a "gate dielectric" is a layer of dielectric between the semiconductor device substrate and the gate conductor.

As used herein, the term "dielectric" denotes a non-metallic material having insulating properties.

As used herein, "insulating" denotes a room temperature conductivity of less than about $10^{-10}$ (Ω-m)$^{-1}$.

As used herein, "high-k" denotes a dielectric material featuring a dielectric constant (k) higher than 3.9.

The term "nitrogen based plasma" means a plasma process including a mixture of $N_2$ and $H_2$ with no intentional introduction of oxygen or fluorine or any other species.

"Plasma" as used herein is a collection of charged particles, i.e., particles stripped of at least on electron. Because the particles in the plasma are electrically charged (generally by being stripped of electrons), it is frequently described as an "ionized gas."

For purposes of the description hereinafter, the terms "upper", "lower", "right", "left", "vertical", "horizontal", "top", "bottom", and derivatives thereof shall relate to the invention, as it is oriented in the drawing figures.

Further, it will be understood that when an element as a layer, region or substrate is referred to as being "atop" or "over" or "overlying" or "below" or "underlying" or "on" another element, it can be directly on the other element or intervening elements may also be present. In contrast, when an element is referred to as being "directly on" or "directly over" of in "direct physical contact" with another element, there are no intervening elements present.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In one embodiment, the present invention provides a method in which a substrate 5 is exposed to an ambience containing a $N_2$ or a $N_2/H_2$ (hereinafter N/H) plasma. In this step, the application of the N or N/H plasma nitrides a gate dielectric that is present in portions of the substrate in which n-type conductivity semiconductor devices are subsequently formed, and nitrides a metal gate conductor that is present in portions of the substrate in which the p-type conductivity semiconductor devices are subsequently formed. A nitrided gate dielectric may improve device performance in n-type semiconductor devices by mitigating the device dimension dependent regrowth and causing a desirable threshold voltage (Vt) shift in the direction of a higher workfunction towards the pFET band-edge (4.9 eV to 5.2 eV). A nitrided metal gate conductor may improve device performance in p-type semiconductor devices by increasing the work function that is increasing with the N dose, which results in a desirable threshold voltage (Vt) that is consistent with the desired pFET workfunctions of 4.9 eV to 5.2 eV for p-type semiconductor devices.

Reference is first made to FIGS. 1-7, which depicts one embodiment of a process for forming gate structures to a complementary metal oxide semiconductor (CMOS device). In one embodiment, the method includes providing a substrate 5 including a first conductivity type region 10, e.g. n-type device region, and a second conductivity region 15, e.g., p-type device region, wherein a gate stack 55 including a gate dielectric 20 is present atop the first conductivity type region 10 and the second conductivity type region 15 and a first metal gate conductor 60 that is present overlying the gate dielectric 20. In a following process step, a portion of the first metal gate conductor 60 that is present in the first conductivity type region 10 is removed to expose the underlying gate dielectric 20. In one embodiment, removing the portion of the first metal gate conductor 60 includes forming an etch mask 24 over the second conductivity type region 15, wherein the first conductivity type region 10 is exposed, and removing, e.g., etching, a portion of the first metal gate conductor 60 over the first conductivity type region 15 to expose a portion of the gate dielectric 20 that is present in the first conductivity type region 15. When present, the etch mask 24 is removed and a nitrogen based plasma 50 is then applied to nitride the exposed portion of the gate dielectric 20 in the first conductivity device region 10 and the remaining portion of the first metal gate conductor 60 that is present in the second conductivity type region 15. The details of the above described methods and structures are now discussed in greater detail.

In one embodiment, the first conductivity type region 10 provides the site for a subsequently formed nFET device and the second conductivity type region 15 provides the site for a subsequently formed pFET device. In another embodiment, the first conductivity type region 10 provides the site for a subsequently formed pFET device and the second conductivity type region 15 provides the site for a subsequently formed nFET device.

The substrate 5 employed in the present invention may be any semiconducting material including, but not limited to: Si, Ge, SiGe, SiC, SiGeC, Ga, GaAs, InAs, InP and all other III/V or II/VI compound semiconductors. The substrate 5 may also include an organic semiconductor or a layered semiconductor such as Si/SiGe, a silicon-on-insulator (SOI) or a SiGe-on-insulator (SGOI). In some embodiments of the present invention, the substrate 5 is composed of a Si-containing semiconductor material, i.e., a semiconductor material that includes silicon. The substrate 5 may be doped, undoped or contain doped and undoped regions therein.

The substrate 5 may also include a first doped (n-or p-) region, and a second doped (n-or p-) region. For clarity, the doped regions are not specifically shown in the drawing of the present application. The first doped region and the second doped region may be the same, or they may have different conductivities and/or doping concentrations. These doped regions are known as "wells".

In one embodiment, at least one isolation region 1 is typically present within the substrate 5. The at least one isolation region 1 may be a trench isolation region or a field oxide isolation region. The trench isolation region is formed utilizing a trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a local oxidation of silicon process. Note that the at least one isolation region 1 provides isolation between neighboring first conductivity type regions 10 and second conductivity type regions 15, typically required when the neighboring gates have opposite conductivities. In one embodiment, a semiconducting region is defined by the portion of the substrate 5 that is positioned between two isolation regions 1.

Still referring to FIG. 1, after forming the at least one isolation region 1 within the substrate 5, a gate stack 55 is formed atop the first conductivity type region 10 and the second conductivity type region 15 of the substrate 5. As shown, the gate stack 55 includes at least a gate dielectric 20 and a gate conductor 60 that is located atop gate dielectric 20. The gate dielectric 20 of the gate stack 55 may be formed on a surface of the substrate 5. In one embodiment, the gate dielectric 20 is formed atop the first conductivity type region 10 and the second conductivity type region 15 of the substrate 5. In one embodiment, the gate dielectric 20 is composed of a high-k gate dielectric material. In another embodiment, the high-k dielectric material is formed by a thermal growth process, such as, for example, oxidation, nitridation or oxynitridation. In another embodiment, the high-k dielectric material is formed by a deposition process such as, for example, chemical vapor deposition (CVD), plasma-assisted CVD, metal organic chemical vapor deposition (MOCVD), atomic layer deposition (ALD), evaporation, reactive sputtering, chemical solution deposition and other like deposition processes. The high-k dielectric material may also be formed utilizing any combination of the above processes.

The high-k dielectric material used as the gate dielectric 20 includes an insulating material having a dielectric constant of greater than 4.0. Typically, the high-k dielectric material has a dielectric constant greater than 7.0. Specifically, the high-k dielectric material employed for the gate dielectric 20 in the present invention includes, but not limited to: an oxide, nitride, oxynitride and/or silicate including metal silicates and nitrided metal silicates. In one embodiment, the high-k dielectric material is composed of $HfO_2$, hafnium silicate and hafnium silicon oxynitride. In another embodiment, the gate dielectric 20 includes a high-k dielectric material composed of an oxide, such as, for example, $ZrO_2$, $Al_2O_3$, $TiO_2$, $La_2O_3$, $SrTiO_3$, $LaAlO_3$, $Y_2O_3$ and mixtures thereof.

The physical thickness of the high-k dielectric material may vary, but in one embodiment of the present invention, the high-k dielectric material has a thickness ranging from 0.5 nm to 10 nm, with a thickness from 0.5 nm to 3 nm being more typical. It may be deposited above a thin (on the order of 0.1 nm to 1.5 nm) layer of silicon oxide or silicon oxynitride that is first deposited on the substrate 5. In some instances, an additional dielectric layer can be located between the gate dielectric 20 and the substrate 5, such as a nitride layer.

A first metal gate conductor 60 is then formed overlying the gate dielectric 20. The first metal gate conductor 60 is formed atop the gate dielectric 20 utilizing a deposition process, such as CVD, plasma-assisted CVD, plating, and/or sputtering, followed by planarization. The first metal gate conductor 60 may include any conductive metal including, but not limited to: W, Ni, Ti, Mo, Ta, Cu, Pt, Ag, Au, Ru, Ir, Rh, and Re, and alloys that include at least one of the aforementioned conductive elemental metals, such as TiN, TaN, MoN etc. When a combination of conductive elements is employed, an optional diffusion barrier material (not shown in the drawing) such as TaN or WN may be formed between the conductive materials. The first metal gate conductor 60 may have a thickness $T_1$ ranging from 5 nm to 50 nm. More typically, the thickness $T_1$ of the first metal gate conductor 60 ranges from 7.5 nm to 20 nm.

Figure 2:
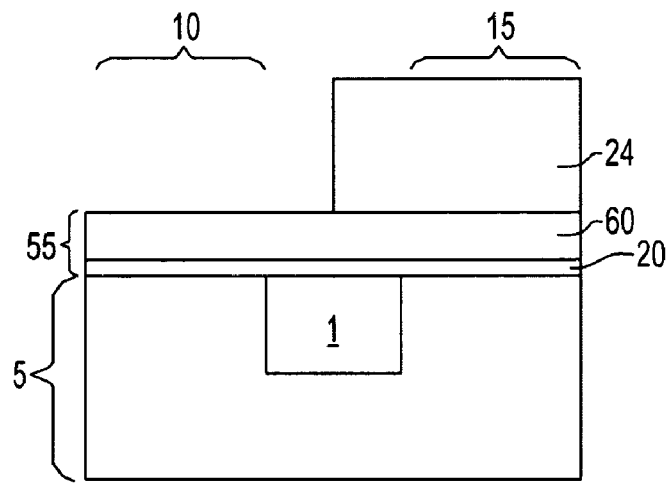
FIG. 2 is a side cross-sectional view depicting forming an etch mask atop the second conductivity type region, wherein the first conductivity type region is exposed.

Referring to FIG. 2, following the formation of the first metal gate conductor 60, an etch mask 24 is formed atop the gate dielectric 20 on the second conductivity type region 15. In one embodiment, formation of the etch mask 24 begins with depositing a photoresist layer atop the first conductivity type region 10 and the second conductivity type region 15. The photoresist layer can be either positive-acting or negative-acting. For most negative-acting photoresists, those coating layer portions that are exposed to an activating radiation polymerize or cross-link in a reaction between a photoactive compound and polymerizable agents of the photoresist composition. Consequently, the exposed coating portions are rendered less soluble in a developer solution than unexposed portions. For positive-acting photoresists, exposed portions are rendered more soluble in a developer solution while areas not exposed remain comparatively less developer soluble.

In general, photoresist compositions include at least a resin binder component and a photoactive agent. A wide variety of polymeric or resin binders may be used in photoresists. Such polymeric binders may include, as polymerized components, one or more acid functional monomers such as acrylic acid or methacrylic acid.

In one embodiment, the photoresist layer is composed of DQN photoresist. DQN photoresist is a two component photoresist that includes diazoquinone (DQ)—photosensitive component) and novolac (N-resin). Typically, the diazoquinone is the photosensitive component and the novolac is not sensitive enough for <300 nm exposure wavelength; common with g-line (436 nm) and i-line (365 nm) exposure tools. The photoresist may be either liquid or dry film. Liquid photoresists are dispensed on a substrate and then cured. Dry film photoresists are typically laminated to a substrate. In one embodiment, the photoresist layer is deposited using spin-on techniques.

Following formation of the photoresist layer atop the first conductivity type region 10 and the second conductivity type region 15 of the substrate 5, the photoresist layer is patterned using photolithography and developed to provide the etch mask 24. More specifically, in one embodiment, a pattern is produced by exposing the photoresist layer to a pattern of radiation, and then developing the pattern into the photoresist utilizing conventional resist developer, such as a chemical solvent. In a positive resist development, the developer leaves a hole in the resist layer that corresponds to the opaque pattern of a reticle (mask) of the photolithography tool. In negative resist development, the developer leaves a pattern in the resist opposite to that on the reticle (mask). Development of the pattern is conducted using conventional development techniques including, but not limited to: continuous spray development and puddle development. In another embodiment, the etch mask 24 may be a hard mask composed of an oxide, nitride or oxynitride material.

In one embodiment and following the formation of the etch mask 24, one of the first conductivity type region 10 and the second conductivity type region 15 is exposed, wherein a remaining portion of the photoresist layer remains overlying the other of the first conductivity type region 10 or the second conductivity type region 15. It is noted that although FIG. 1 depicts the remaining portion of the photoresist layer, i.e., the etch mask 24, overlying the second conductivity type region 15, i.e., p-type device region, the method of the present invention is equally applicable to where the remaining portion of the photoresist layer, i.e., the etch mask 24, is positioned overlying the first conductivity type region 10, i.e., n-type device region.

Figure 3:
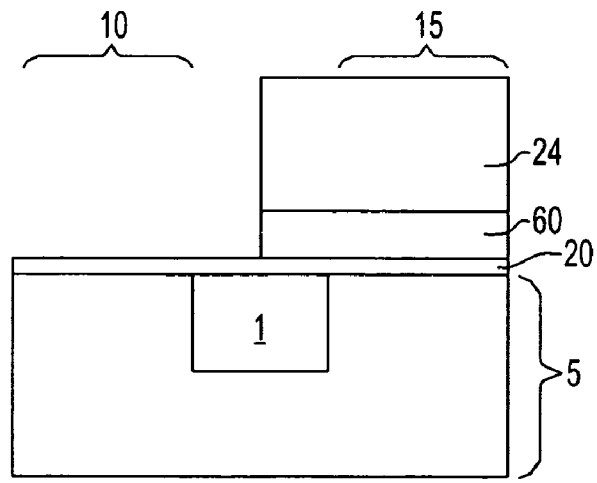
FIG. 3 is a side cross-sectional view depicting removing a portion of the first metal gate conductor that is present in the first conductivity type region to expose the gate dielectric present in the first conductivity type region, wherein a remaining portion of the metal gate conductor is present in the second conductivity type region.
Figure 4:
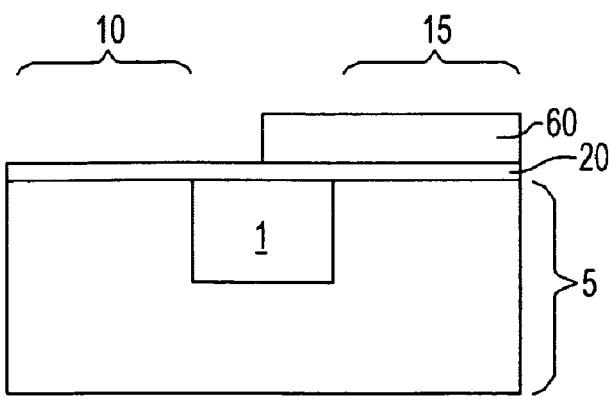
FIG. 4 is a side cross-sectional view depicting removing the etch mask, in accordance with one embodiment of the present invention.

FIG. 3 depicts etching the exposed portion of the first metal gate conductor 60 stopping on the gate dielectric 20 in the first conductivity type region 10, i.e., n-type device region, in which the etch mask 24 protects the portion of the first metal gate conductor 60 that is present in the second conductivity type region 15, i.e, p-type device region. In one embodiment, the etch process is provide by an anisotropic etch, such as reactive ion etch. In one embodiment, the etch process removes the first metal gate conductor 60 selective to the gate dielectric 20. In one example, the etch process that removes the first metal gate conductor 60 includes an etch chemistry composed of $Cl_2$ and Ar. Following removal of the first metal gate conductor 60 to expose the underlying gate dielectric 20 in the first conductivity type region 10, the etch mask 24 is removed, as depicted in FIG. 4. When the etch mask 24 is composed of a photoresist material, the etch mask 24 may be removed using oxygen ashing.

Figure 5:
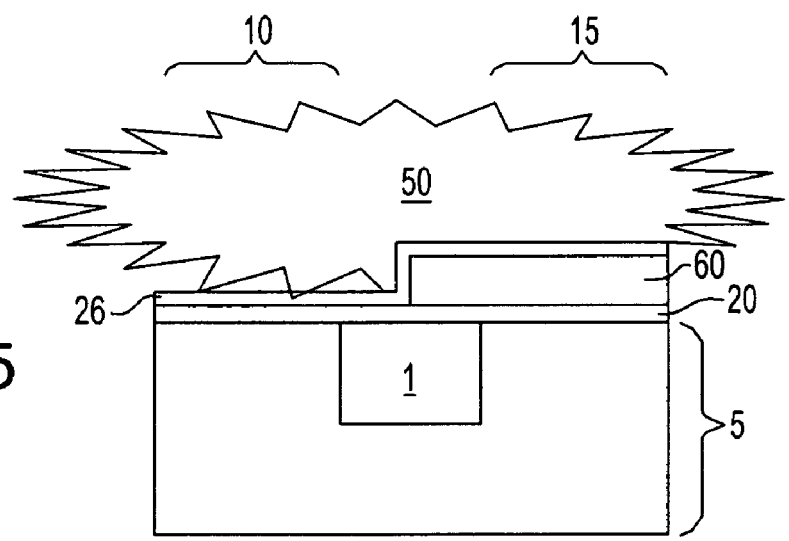
FIG. 5 is a side cross-sectional view depicting applying a nitrogen based plasma to the gate dielectric that is present in the first conductivity type region and the first metal gate conductor that is present in the second conductivity type region.

Referring to FIG. 5, a nitrogen based plasma 50 is then applied to the first conductivity type region 10 and the second conductivity type region 15 of the substrate 5, wherein the nitrogen based plasma 50 produces a nitrogen containing layer 26 on and/or within the exposed portion of the gate dielectric 20 in the first conductivity type region 10, i.e., n-type device region, and produces a nitrogen containing layer 26 on and/or within the remaining portion of the first metal gate conductor 60 in the second conductivity type region 15, i.e., p-type device region.

In one embodiment, the nitrogen based plasma 50 nitrides the gate dielectric 20 that is present in the first conductivity type region 10 and nitrides the first metal gate conductor 60 that is present in the second conductivity type region 15, wherein the nitrogen content in the gate dielectric 20 ranges from 0% to 50%, and the nitrogen content of the first metal gate conductor 60 ranges from 0% to 60%. In some instances, the nitrogen content of the gate dielectric 20 may be greater than 50%, and in some instances the nitrogen content of the first metal gate conductor 60 may be greater than 60%. In one example, the nitrogen containing layer 26 that is present in the first conductivity type region 10 is a portion of the exposed portion of the gate dielectric 20 that has a thickness ranging from 1 nm to 10 nm, as measured from the top surface of the gate dielectric 20, and has a nitrogen concentration ranging from 0% to 50%, typically being greater than 1%. In another example, the nitrogen concentration in the aforementioned portion of the gate dielectric 20 ranges from 10% to 50%, typically ranging from 25% to 50%. In one example, the nitrogen containing layer 26 that is present in the second conductivity type region 15 is a remaining portion of the first metal gate conductor 60 that has a thickness ranging from 1 nm to 20 nm, as measured from the top surface of the first metal gate conductor 60, and has a nitrogen concentration ranging from 0% to 60%, typically being greater than 1%. In another example, the nitrogen concentration in the aforementioned portion of the first metal gate conductor 60 ranges from 10% to 60%, typically ranging from 25% to 60%.

A nitrided gate dielectric 20, 26 may improve device performance in n-type semiconductor devices by mitigating the device dimension regrowth effect and causing a desirable threshold voltage (Vt) shift that is dependent on the N dose added and is controlled to the shifts needed. A nitrided metal gate conductor 26, 60 may improve device performance in p-type semiconductor devices by increasing the effective work function to a value ranging from 4.9 eV to 5.2 eV, which results in a desirable threshold voltage (Vt) for p-type semiconductor devices. The effective work function of the n-type semiconductor devices ranges from 4.1 eV to 4.3 eV.

In one embodiment, a n-type semiconductor device incorporating the gate dielectric 20 having the nitride containing layer 26 present thereon/therein may have a threshold voltage ranging from about 0.0 mV to about 300 mV. In one embodiment, a p-type semiconductor device incorporating the first metal gate conductor 60 having the nitride containing layer 26 present thereon/therein may have a threshold voltage ranging from about 0.0 mV to about 300 mV.

In one embodiment, the nitrogen based plasma 50 is composed of $N_2/H_2$. The nitrogen based plasma may further include radicals composed of $O_2$ and Si. In one embodiment, the nitrogen based plasma 50 is composed of 1% to 10% of $H_2$ in $N_2/H_2$ and is substantially free of $O_2$. In one embodiment, the $O_2$ content of the nitrogen based plasma 50 is less than 0.01%. In another embodiment, the $O_2$ content of the nitrogen based plasma 50 is less than 0.5%. In another embodiment, the nitrogen based plasma 50 is completely devoid of $O_2$.

In one example, the fluoride content of the nitrogen based plasma 50 is 0.5% or less. In another example, the nitrogen based plasma 50 is completely devoid, i.e., 0.0%, of fluoride. In one embodiment, the flow rate of the nitrogen based plasma 50 ranges from 2,000 sccm to 11,000 sccm. In another embodiment, the flow rate of the nitrogen based plasma 50 ranges from 8,000 sccm to 10,000 sccm. Typically, the RF power of the nitrogen based plasma 50 ranges from 1,000 W to 3,000 W. More typically, the RF power of the nitrogen based plasma 50 ranges from 1,500 W to 2,500 W. Even more typically, the RF power of the nitrogen based plasma ranges 50 from 500 W to 5000 W.

In one embodiment, the temperature during the application of the nitrogen based plasma 50 ranges from about room temperature to 300° C. In another embodiment, the temperature during the application of the nitrogen based plasma 50 ranges from 25° C. to 350° C. In a further embodiment, the temperature during the application of the nitrogen based plasma 50 ranges from 100° C. to 300° C.

Figure 6:
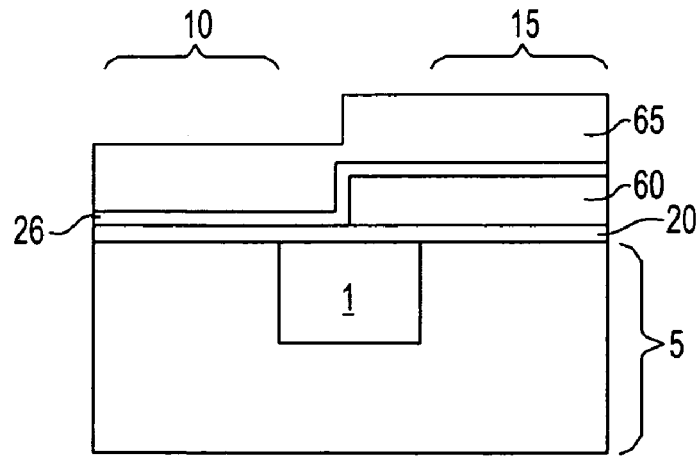
FIG. 6 is a side cross-sectional view depicting forming a second metal gate conductor atop at least the gate dielectric that is present in the first conductivity type region.

Referring to FIG. 6, following the application of the nitrogen containing plasma 50, a second metal gate conductor 65 may be deposited atop the nitride containing layer 26 in the first conductivity type region 10 and the second conductivity type region 15. The second metal gate conductor 60 may be deposited by physical vapor deposition (PVD), e.g., sputtering or plating. In one example, the second metal gate conductor 65 is composed of TaN, W, WN, Ti, TiN or combinations thereof. In another example, the second metal gate conductor 65 has a thickness ranging from 1 nm to 50 nm.

Figure 7:
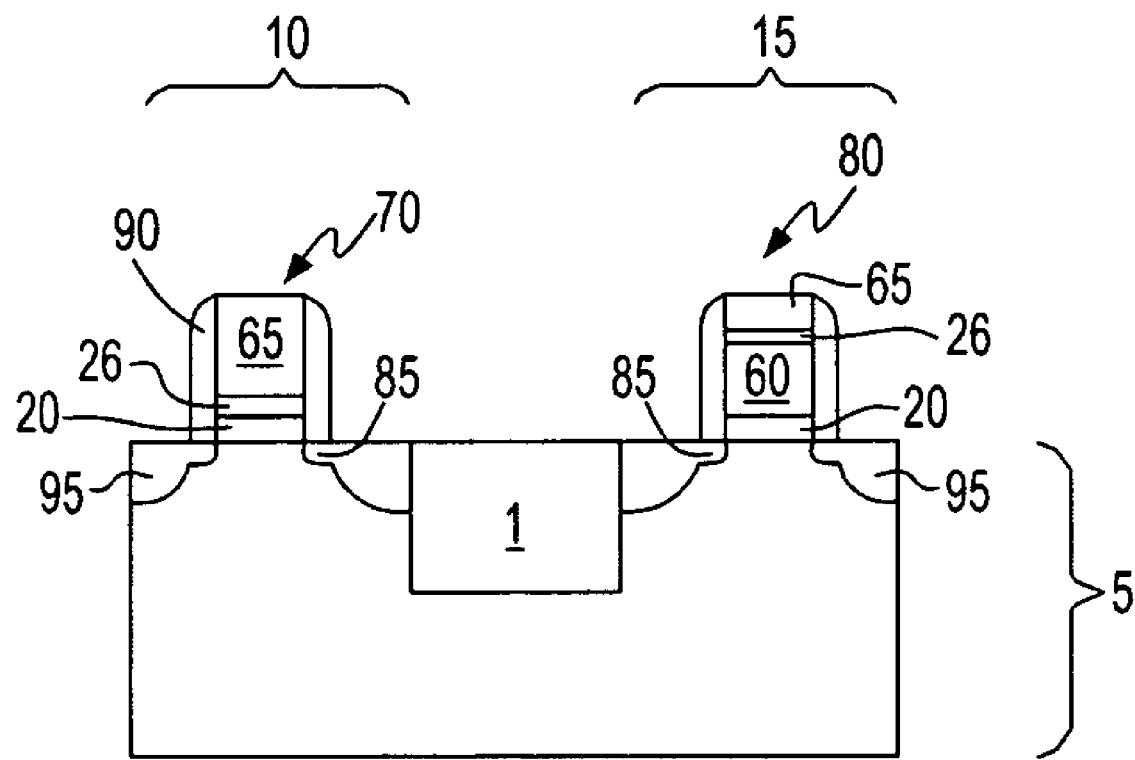
FIG. 7 is a side cross-sectional view depicting one embodiment of forming semiconducting devices from the structure depicted in FIG. 6.

Referring to FIG. 7, following the formation of the second metal gate conductor 65, the first conductivity type region 10 and the second conductivity type region 15 may be processed to provide semiconducting devices. The nitrided gate dielectric 20, 26 (also referred to as the portion of the gate dielectric 20 that includes a nitrogen containing layer 26 and is present in the first conductivity type region 10) may provide the gate dielectric of a gate structure to an n-type field effect transistor (FET). For example, field effect transistors (FETs) are formed including gate structures including the first metal gate conductor 60 atop the nitrided gate dielectric 20. An nFET may be formed including a first metal gate conductor 60 composed of titanium nitride (TiN) and a nitrided gate dielectric 20, 26 composed of a high-k dielectric material, such as hafnium oxide ($HfO_2$), wherein a layer of aluminum oxide ($Al_2O_3$) may be present at the interface of the first metal gate conductor 60 and the nitrided gate conductor 26, 60. In one example, the nFET includes a metal gate conductor composed of tungsten nitride (WN) and a high-k dielectric material 20 composed of $HfO_2$. A pFET may be formed including a nitrided first metal gate conductor 26, 60 (also referred to as the remaining portion of the first metal gate conductor 60 that includes a nitrogen containing layer 26 and is present in the second conductivity type region 15) composed of titanium nitride (TiN) and a gate dielectric 20 composed of hafnium oxide ($HfO_2$), wherein a layer of tantalum oxide (TaO) may be present at the interface of the nitrided first metal gate conductor 26, 60 and the gate dielectric 20.

In one embodiment, the layered stack including the second metal gate conductor 65, the nitrogen containing layer 26, the first metal gate conductor 60, and the high-k dielectric material 20 is patterned and etched to provide a first gate structures 70 in the first conductivity region 10 and a second gate structure 80 in the second conductivity region 15 of the substrate 5. The first gate structure 70 includes the nitrided gate dielectric 20, 26, and the second metal gate conductor 65, and the second gate structure 80 includes the high-k dielectric material 20, the nitrided gate conductor 26, 60, and the second metal gate conductor 65.

More specifically, in one embodiment, forming the gate stacks 70, 80 may include depositing a layer of photoresist (not shown) atop the entire structure depicted in FIG. 6. The photoresist layer is then selectively patterned and developed to provide an photoresist mask (etch mask)(not shown) protecting the portion of layered stack of the second metal gate conductor 65/first metal gate conductor 60/high-k dielectric material 20 corresponding to the subsequently formed gate stacks 70, 80. The exposed regions of the layered stack of the metal gate conductor 60/high-k dielectric material 20 are then etched, while the regions underlying the photoresist mask are protected to provide the gate stacks 70, 80 corresponding to FET devices. Following formation of the gate stacks, the photoresist mask is removed by a stripping process, such as oxygen ashing.

In a following process step, extension source and drain regions 85 may then be formed in the first conductivity region 10 and the second conductivity region 15 of the substrate 5. Source and drain offset spacers 90 may then formed abutting the first gate structure 70 and the second gate structure 80, and deep source and drain regions 95 are formed in the first conductivity region 10 and the second conductivity region 15 of the substrate 5, as depicted in FIG. 7.

In one embodiment, the aforementioned method provides the semiconductor device depicted in FIG. 7. The semiconductor device includes a substrate 5 having a p-type device region (first conductivity region 10) and an n-type device region (second conductivity region 15), in which at least one nFET present in the n-type device region and at least one pFET is present in the p-type device region. In one embodiment, each of the at least one nFET includes a gate structure (gate stack 70) including a Hf-containing gate dielectric (high-k gate dielectric 20) present on the substrate 5 having a nitrided upper surface (nitrogen containing layer 26), and a gate conductor (second metal gate conductor 65) directly on the nitrided upper surface of the Hf-containing gate dielectric. In one embodiment, each of the at least one pFET includes a gate structure (gate stack 80) including a Hf-containing gate dielectric (high-k gate dielectric 20) present on the substrate 5 having an upper surface substantially free of nitride, and a gate conductor (first metal gate conductor 60) present directly on the Hf-containing gate dielectric having the upper surface substantially free of nitride, wherein an upper surface of the gate conductor in the gate structure of the at least one pFET is a nitrided upper surface (nitrogen containing layer 26). The substantially free of nitride means less than 10.0% nitride, typically less than 5.0% nitride, more typically less than 1.0% nitride, and in some embodiments 0.0% nitride. In one embodiment, the gate structure to the at least one pFET further includes another gate conductor present on the upper surface of the gate conductor that has the nitrided upper surface (second metal gate conductor 65).

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed as new is:

1. A method of forming a semiconductor device comprising:
   forming a gate stack including a gate dielectric and a first metal gate conductor atop a first conductivity type region and a second conductivity type region of a substrate;
   removing a portion of the first metal gate conductor that is present atop the first conductivity type region to expose the gate dielectric present atop the first conductivity type region, wherein a remaining portion of the first metal gate conductor is present atop the second conductivity type region;
   nitriding the gate dielectric that is present atop the first conductivity type region and the first metal gate conductor that is present atop the second conductivity type region, wherein the nitriding comprises applying a nitrogen based plasma to the gate dielectric and the first metal gate conductor; and
   forming a second metal gate conductor overlying at least the gate dielectric that is present atop the first conductivity type region.

2. The method of claim 1, wherein the first conductivity type region is processed to provide at least one nFET device and the second conductivity type region is processed to provide at least one pFET device.

3. The method of claim 1, wherein the gate dielectric is composed of a high-k gate dielectric.

4. The method of claim 1, wherein removing the portion of the first metal gate conductor that is present atop the first conductivity type region to expose the gate dielectric present atop the first conductivity region comprises forming an etch mask overlying the second conductivity type region, wherein the first conductivity type region is exposed; removing a portion of the first metal gate conductor that is present atop the first conductivity type region to expose the gate dielectric present atop the first conductivity type region; and removing the etch mask.

5. The method of claim 1, wherein said applying the nitrogen based plasma further comprises an $N_2/H_2$ plasma including radicals comprised of $O_2$ and Si.

6. The method of claim 1, wherein the nitrogen based plasma nitrides the gate dielectric that is present atop the first conductivity type region and nitrides the first metal gate conductor that is present atop the second conductivity type region, wherein the nitrogen content in the gate dielectric ranges from 0% to 50%, and the nitrogen content of the first metal gate conductor ranges from 0% to 60%.

7. The method of claim 1 further comprising an anneal process following the nitrogen based plasma having a temperature of 1050° C. or less.

8. A method of forming a semiconductor device comprising:
   forming a gate stack including a gate dielectric and a first metal gate conductor atop a first conductivity type region and a second conductivity type region of a substrate;
   forming an etch mask overlying the second conductivity type region, wherein the first conductivity type region is exposed;
   removing a portion of the first metal gate conductor that is present in the first conductivity type region to expose the gate dielectric atop the first conductivity type region;
   removing the etch mask;
   applying a nitrogen based plasma to the gate dielectric that is atop the first conductivity type region and to the first metal gate conductor that is atop the second conductivity type region, wherein the applying the nitrogen based plasma to the gate dielectric and the first metal gate conductor comprises an $N_2/H_2$ plasma; and
   forming a second metal gate conductor overlying at least the gate dielectric that is atop the first conductivity type region.

9. The method of claim 8, wherein the first metal gate conductor comprises at least one of W, Ni, Ti, Mo, Ta, Cu, Pt, Ag, Au, Ru, Ir, Rh, and Re.

10. The method of claim 8, wherein the gate dielectric comprises $HfO_2$, hafnium silicate, hafnium silicon oxynitride, $ZrO_2$, $Al_2O_3$, $TiO_2$, $La_2O_3$, $SrTiO_3$, $LaAlO_3$, $Y_2O_3$ or mixtures thereof.

11. The method of claim 8, wherein the etch mask is composed of a photoresist material.

12. The method of claim 8, wherein said applying the nitrogen based plasma to the substrate further comprises radicals comprised of $O_2$ and Si.

13. A method of forming a semiconductor device comprising:

forming a gate stack including a gate dielectric and a first metal gate conductor atop an n-type device region and a p-type device region of a substrate;

forming an etch mask overlying the p-type device region, wherein the n-type device region is exposed;

removing a portion of the metal gate conductor that is atop the n-type device region to expose the gate dielectric that is atop the n-type device region;

removing the etch mask;

applying a nitrogen based plasma to the gate dielectric that is atop the n-type device region and to the first metal gate conductor that is atop the p-type device region; and forming a second metal gate conductor overlying at least the gate dielectric that is atop the n-type device region.

14. The method of claim 13 further comprising forming a first semiconductor device in a n-type device region having an effective work function ranging from 4.1 eV to 4.3 eV, and a second semiconductor device in the p-type device region having a effective work function ranging from 4.9 eV to 5.2 eV.

15. The method of claim 14, wherein the first metal gate conductor comprises a high workfunction metal and the second metal gate conductor comprises of a low workfunction metal.

\* \* \* \* \*